United States Patent
Elhadj et al.

(10) Patent No.: US 9,790,090 B2
(45) Date of Patent: Oct. 17, 2017

(54) LASER-INDUCED GAS PLASMA MACHINING

(71) Applicant: Lawrence Livermore National Security, LLC, Livermore, CA (US)

(72) Inventors: Selim Elhadj, Livermore, CA (US); Isaac Louis Bass, Castro Valley, CA (US); Gabriel Mark Guss, Manteca, CA (US); Manyalibo J. Matthews, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 456 days.

(21) Appl. No.: 13/797,495

(22) Filed: Mar. 12, 2013

(65) Prior Publication Data

US 2014/0224776 A1 Aug. 14, 2014

Related U.S. Application Data (60) Provisional application No. 61/764,482, filed on Feb. 13, 2013.

(51) Int. Cl.
*B23K 26/00* (2014.01)
*B81C 1/00* (2006.01)
(Continued)

(52) U.S. Cl.
CPC ...... *B81C 1/00523* (2013.01); *B23K 26/0066* (2013.01); *B23K 26/1462* (2015.10);
(Continued)

(58) Field of Classification Search
USPC .... 219/121.6, 121.65, 121.66, 121.7, 121.71
See application file for complete search history.

(56) References Cited

U.S. PATENT DOCUMENTS 4,505,949 A * 3/1985 Jelks ...................... C23C 14/22
427/562
5,043,548 A * 8/1991 Whitney ................ B05B 7/228
219/121.47

(Continued)

FOREIGN PATENT DOCUMENTS

KR 10-2002-0044347 A 6/2002
WO WO 2010/149438 A1 12/2002
(Continued)

OTHER PUBLICATIONS

Notification of Transmittal of The International Search Report and The Written Opinion of The International Searching Authority, or The Declaration and International Search Report and Written Opinion of The International Searching Authority for International Application No. PCT/US2014/016323 mailed on May 26, 2014, 14 pages.
(Continued)

*Primary Examiner* — Quang D Thanh
*Assistant Examiner* — Ayub Maye
(74) *Attorney, Agent, or Firm* — Kilpatrick Townsend & Stockton (57) ABSTRACT

Techniques for removing material from a substrate are provided. A laser beam is focused at a distance from the surface to be treated. A gas is provided at the focus point. The gas is dissociated using the laser energy to generate gas plasma. The substrate is then brought in contact with the gas plasma to enable material removal.

10 Claims, 10 Drawing Sheets

(51) Int. Cl.
*H05H 1/46* (2006.01)
*B23K 26/14* (2014.01)
*B23K 26/361* (2014.01)
*H01J 37/32* (2006.01)

(52) U.S. Cl.
CPC .............. *B23K 26/361* (2015.10); *H05H 1/46* (2013.01); *H01J 37/32449* (2013.01)

(56) References Cited

U.S. PATENT DOCUMENTS

| | | | | |
|---|---|---|---|---|
| 5,104,481 | A * | 4/1992 | Dooley | G03F 1/76 216/62 |
| 5,866,870 | A * | 2/1999 | Walduck | B23K 26/1429 219/121.45 |
| 6,281,472 | B1 * | 8/2001 | Faerber | B23K 35/383 219/121.64 |
| 7,241,965 | B2 * | 7/2007 | Burt | B23K 26/147 219/121.63 |
| 2002/0170892 | A1 | 11/2002 | Lee et al. | |
| 2003/0112322 | A1 * | 6/2003 | Tanaka | 347/241 |
| 2003/0155328 | A1 * | 8/2003 | Huth et al. | 216/65 |
| 2004/0124176 | A1 * | 7/2004 | Li | C23C 22/63 216/67 |
| 2004/0188397 | A1 * | 9/2004 | Connally | B23K 10/00 219/121.67 |
| 2005/0011868 | A1 * | 1/2005 | Matile | B23K 28/02 219/121.64 |
| 2005/0269301 | A1 | 12/2005 | Burrowes et al. | |
| 2006/0049156 | A1 * | 3/2006 | Mulloy et al. | 219/121.71 |
| 2006/0096962 | A1 * | 5/2006 | Park | B23K 26/0057 219/121.72 |
| 2007/0045252 | A1 | 3/2007 | Kleine et al. | |
| 2007/0045255 | A1 * | 3/2007 | Kleine | B23K 26/38 219/121.72 |
| 2009/0050612 | A1 * | 2/2009 | Serruys | B23K 26/032 219/121.83 |
| 2009/0084399 | A1 | 4/2009 | Lee | |
| 2012/0244032 | A1 * | 9/2012 | Lappalainen et al. | 420/433 |

FOREIGN PATENT DOCUMENTS

| | | |
|---|---|---|
| WO | 2009125284 A1 | 10/2009 |
| WO | 2010149438 A1 | 12/2010 |

OTHER PUBLICATIONS

EP14751934.2, "Extended European Search Report", Nov. 18, 2016, 10 pages.

* cited by examiner

LASER-INDUCED GAS PLASMA MACHINING

CROSS-REFERENCES TO RELATED APPLICATIONS

This application claims priority under 35 USC §119(e) to U.S. Provisional Patent Application No. 61/764,482, filed on Feb. 13, 2013, the contents of which are incorporated by reference herein in their entirety for all purposes.

STATEMENT AS TO RIGHTS TO INVENTIONS MADE UNDER FEDERALLY SPONSORED RESEARCH AND DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND

Conventional forms of laser machining for metals and other types of surfaces use gas to pull the evaporated material away from the surface being machined. In addition, conventional methods of laser machining tend to substantially heat the surface of the substrate being machined. The heating induces residual stress in the substrate, increases the amount of re-deposited material, increases material flow due to melting of the surface material, and/or compromises the surface finish and may end up damaging the substrate.

It would be beneficial to have a laser machining process that can eliminate and/or reduce the harmful effects of conventional laser machining mentioned above.

SUMMARY

Embodiments of the present invention are generally related to machining of various surfaces. Specifically, embodiments of the present invention relate to using gas-plasma generated using laser energy to machine a surface a substrate. In a particular embodiment, laser energy is used to breakdown a gas to form a reactive gas-plasma cloud in the vicinity of the substrate. The substrate is then brought in contact with the gas-plasma cloud in order to machine the desired portion of the substrate.

Some embodiment of the present invention provide a method for removing material from a substrate. The method includes providing a substrate that has a first surface and an opposing second surface. The method further includes focusing a laser beam at a focus point located at a predetermined distance from the first surface and providing a gas at or near the focus point. Thereafter the method includes generating gas plasma by breaking down the gas using energy provided by the laser beam and exposing a portion of the first surface to the gas plasma. Finally the method includes removing material from the portion of the first substrate.

In a particular embodiment, the focus point is located in front of the first surface and the predetermined distance is between 3 mm and 10 mm. The gas plasma may propagate in a direction away from the focus point and the first surface. In some embodiments, the gas comprises one of: air, Nitrogen, Argon, Hydrogen, Hydrogen Fluoride (HF), or Carbon Tetraflouride (CF4). In the method, exposing the portion of the first surface may further include moving the substrate such that the substrate is disposed an angle to an axis of the laser beam; and moving the substrate such that the portion of the substrate is in physical contact with the gas plasma when the substrate is disposed at the angle. In some embodiments, the angle is less than 20 degrees. In a particular embodiment, the half-life of the gas plasma is in range of between 10 µs and 100 µs. The lifetime of the plasma depends on gas density (pressure), volume of the plasma, and degree of ionization of the gas. Molecular recombination events occur at a greater rate in denser plasma clouds. Cooling of plasma occurs by expansion, conduction, convection along with ionization/recombination. A big volume may take longer to reach a lower average density than a small volume.

Certain embodiments of the present invention provide a system. The system includes a laser source configured to generate a laser beam, a focusing lens disposed in the path of the laser beam and configured to focus the laser beam at a focus point, a gas source configured to deliver a gas at or near the focus point, and a substrate having a first surface and an opposing second surface. The substrate may be disposed such that the first surface is located a first distance from the focus point, wherein the focus point is located between the focusing lens and the substrate. The system is operable to generate gas plasma in the vicinity of the focus point. The gas plasma propagates in a direction along the path of the laser beam and away or opposite from the direction of beam propagation. The system can further enable movement of the substrate to expose a portion of the substrate to the gas plasma and remove material from the portion of the substrate using the gas plasma.

In an embodiment, the laser source includes a YAG laser and the gas includes one of air, Nitrogen, Argon, Hydrogen, Hydrogen Fluoride (HF), or Carbon Tetraflouride (CF4). The substrate can include one of: fused-silica, metal, or ceramic. In some embodiments, first distance is between 3 mm and 10 mm and the substrate may be disposed at an angle with respect to the path of the laser beam. In a particular embodiment, the angle is less than 20 degrees. In another embodiment, the system may also include a nozzle. The nozzle may be disposed between the focusing lens and the substrate such that the focus point is located within the nozzle. In this embodiment the gas source is coupled to the nozzle and is capable of providing the gas having a flow rate of between 5 L/min and 20 L/min. Further in this embodiment, the system may use residual gas left over after generation of the gas plasma to propagate the gas plasma towards the substrate. In some embodiments, the nozzle can act to obstruct the diverging light of the laser beam and reduce exposure of the surface to the incoming beam.

A yet another embodiment of the present invention provides another method for removing material from a substrate. The method includes providing a substrate having a first surface and an opposing second surface and focusing a laser beam at a focus point located at a first distance from the second surface of the substrate. In this embodiment, the laser beam passes through the substrate after impinging on the first substrate. The method further includes providing a gas at or near the focus point and generating gas plasma by breaking down the gas using energy from the laser beam. The gas plasma is oriented away from the focus point and towards the second surface of the substrate. The method also includes moving the substrate to expose a portion of the second surface to the gas plasma and removing material from the portion of the second surface.

The following detailed description, together with the accompanying drawings will provide a better understanding of the nature and advantages of the present invention.

DETAILED DESCRIPTION

Embodiments of the present invention generally relate to laser-based machining of substrates. It is to be noted that many types of substrates can be machined using the techniques described herein. However, a fused-silica based optical component is used as an example throughout the specification to explain the various embodiments of the present invention.

Gas-plasma laser machining techniques as described herein can impact the surface finish/roughness/quality, by melting, flow, or surface molecular relaxation, even without any significant evaporation (for the duration of the heating). The surface finish, roughness effect can occur because of (a) modification of the surface chemistry and therefore of the interfacial energy, e.g., the tendency for a rough surface to flatten out is greater for greater interfacial energies, (b) modification of the temperature dependence of the interfacial energy driving the Marangoni flow, and (c) lowering evaporation temperature thereby increasing viscosity and reducing material flow, thus reducing rim formation.

Lasers can be used for various machining activities such as drilling, cutting, removing coating of one material from another material, marking/engraving, surface finishing/smoothing, etc. Embodiments of the present invention relate to using gas-plasma generated using a laser to remove material from a surface of a substrate. In addition, embodiments of the present invention may be used in melting, flowing, or surface finishing of material without removal of material. However, the techniques disclosed herein are applicable to any other applications of laser machining. Specifically, embodiments of the present invention are described using fused-silica based optics components. One skilled in the art will realize that the techniques disclosed herein are equally applicable to laser machining of metals, ceramics, and other types of material.

Silica is used in many industrial applications such as raw material in refractory linings, fiber optics, optical substrates and, in general, as a component in devices requiring inertness and toughness. However, silica is difficult to process. High temperatures above the glass working point (~2400° K) are used for molding of fused silica, while very reactive species are needed for chemical etching of silica. Furthermore, many of silica's processing properties depend greatly on temperature. In particular, evaporative etching of silica uses extreme temperatures approaching the boiling point of silica, e.g., 3000° K. Such temperatures are not practical for machining under ambient conditions. In applications where localized heating is used for machining glass in air these high temperature requirements often cause unwanted increases in residual stresses, formation of rim structures, and redeposit defects of the glass. A reduction in the treatment temperature for material removal greatly improves thermal processing by reducing and/or eliminating these unwanted factors. In one embodiment of the present invention the laser-generated gas-plasma is used for material removal without the laser directly incident on the substrate surface.

Conventional laser machining relies on laser-based evaporation of the material and on the velocity of escaped species within the Knudsen layer close to a hot surface. However, conventional techniques do not include any chemical reactions from a reacting gas, or any shift in the equilibrium of the evaporation reactions from the presence of a gas phase product. In addition in conventional techniques, the gas used for material removal does not react directly with the material during the evaporation process. Embodiments of the present invention provide generation of gas-plasma using laser energy. The gas-plasma is generated at a distance from the surface of substrate. The substrate is then brought in contact with the gas-plasma to effect the machining.

Conventionally, laser based damage mitigation on silica optics has primarily been addressed by locally irradiating surfaces to remove damage sites. As explained above, this process leaves a pit on the surface from evaporation, ablation, and material flow. In some instances, careful pit shaping may reduce beam modulation to levels below damage threshold, and also minimize formation of caustic rim structures at the periphery of the pit. Continuous increases in both laser beam fluence and shot turnover rates increase the stringency of the damage mitigation strategies.

The formation of rims on laser treated surfaces is usually associated with displacement of melted silica by either Marangoni driven flow or from recoil pressure that push material from the center of the pit to the outside. One damage mitigation approach focuses a moving beam of short $CO_2$ laser pulses (in the ~µs range) that progressively and locally ablates the material into the desired shape, while reducing heating of the substrate. In spite of the high peak temperatures reached, e.g., ~4500K, this reduction in substrate heating is due to the short thermal diffusion lengths ~$\sqrt{Dt_{exp}}$ from the short, but intense microsecond exposures, where D is the thermal diffusion and $t_{exp}$, the laser exposure time. Another, lower temperature approach, e.g., in the ~2000-3000K range, uses a simpler protocol with a fixed CW $CO_2$ beam under steady state laser heating conditions ($t_{exp}$~seconds). Drawbacks of these long laser exposures include significant bulk material heating, densification, residual stress, and large rims, making this approach more problematic for routine damage mitigation. In some instances, reactive assist gases have been applied to reduce the laser treatment temperature by about ~250K depending on the gas chemistry used. That reduction in temperature increases melt viscosity while reducing thermocapillary flow and residual stress. However, because fused silica is highly inert even under reactive gas atmospheres, high evaporation temperatures around 2800K are still required to remove and flow enough material over practical time scales. To lower the treatment temperature further below the glass transition point, extremely reactive gases, such as CF4 or HF, could potentially be used. However these gases are toxic and difficult to handle in processing facilities designed for large aperture optics.

Embodiments of the present invention provide techniques in which an intense beam can ignite plasma in air with a high degree of ionization at the focus point of the laser. The gas-plasma thus formed can then displace or react with the silica surface to produce volatile species. Most of the laser energy can be coupled into the gas while leaving the surface un-affected, except for the plasma etching and, with a minimal thermal footprint to prevent rim formation. The temperature of the plasma cools off faster than the plasma decay. Furthermore, although the gas-plasma is very reactive, it is also short-lived due to rapid ionic recombination at atmospheric pressures. Thus, the source of the plasma is chemically quenched well before propagating into the surrounding, making it safe for use as a localized etching gas. In certain embodiments, a gas (e.g., air or $N_2$) is optically broken down with intense laser pulses to generate an etching plasma near the optical component being treated without damaging the optical component.

Many advantages are realized by using the embodiments of the present invention. For example, techniques described herein lower the evaporation temperature for a given evaporation rate of the material and thus etching of material can be performed at reduced temperatures. This lowering in the amount of laser deposited energy as expressed by the temperature of the material, along with the corresponding reduction in the structural modifications of the material helps in reducing stress and residual stress after cooling of the material and increase the materials lifetime, while reducing the extent to which the material will damage in case of failure (e.g. reduced fracture size from smaller stress fields) and also helps in reducing material flow. Another advantage is that reduced laser energy is needed to evaporate/etch the material for a desired etch rate compared to conventional processes. In addition, techniques disclosed herein also help to reduce the amount of the apparent re-deposited material on the surface thus reducing structural and optical defects of the machined surface. Additionally, using a gas-plasma that is generated away from the surface of the substrate results in reduction or even elimination of rim formations and curvatures due to Marangoni flow at the heated site edges. This helps to preserve a flatter surface with fewer features that can act to intensify propagated light when the material is used to steer light in optical applications. Similar surface topology and process improvements can be obtained for other materials such as metals, ceramics, etc. Gas-plasma generated using embodiments described herein are highly reactive without requiring thermal decomposition of the material on the substrate for material removal. Such gas-plasma is also safer because of its short lifetime compare to aggressive and toxic gases like Hydrogen Fluoride (HF).

The following embodiments of the present invention are described primarily in relation to fused silica-based material. However, it is to be understood that the embodiments described below are equally applicable to other types of materials such as metals, ceramics, etc. as well.

Figure 1:
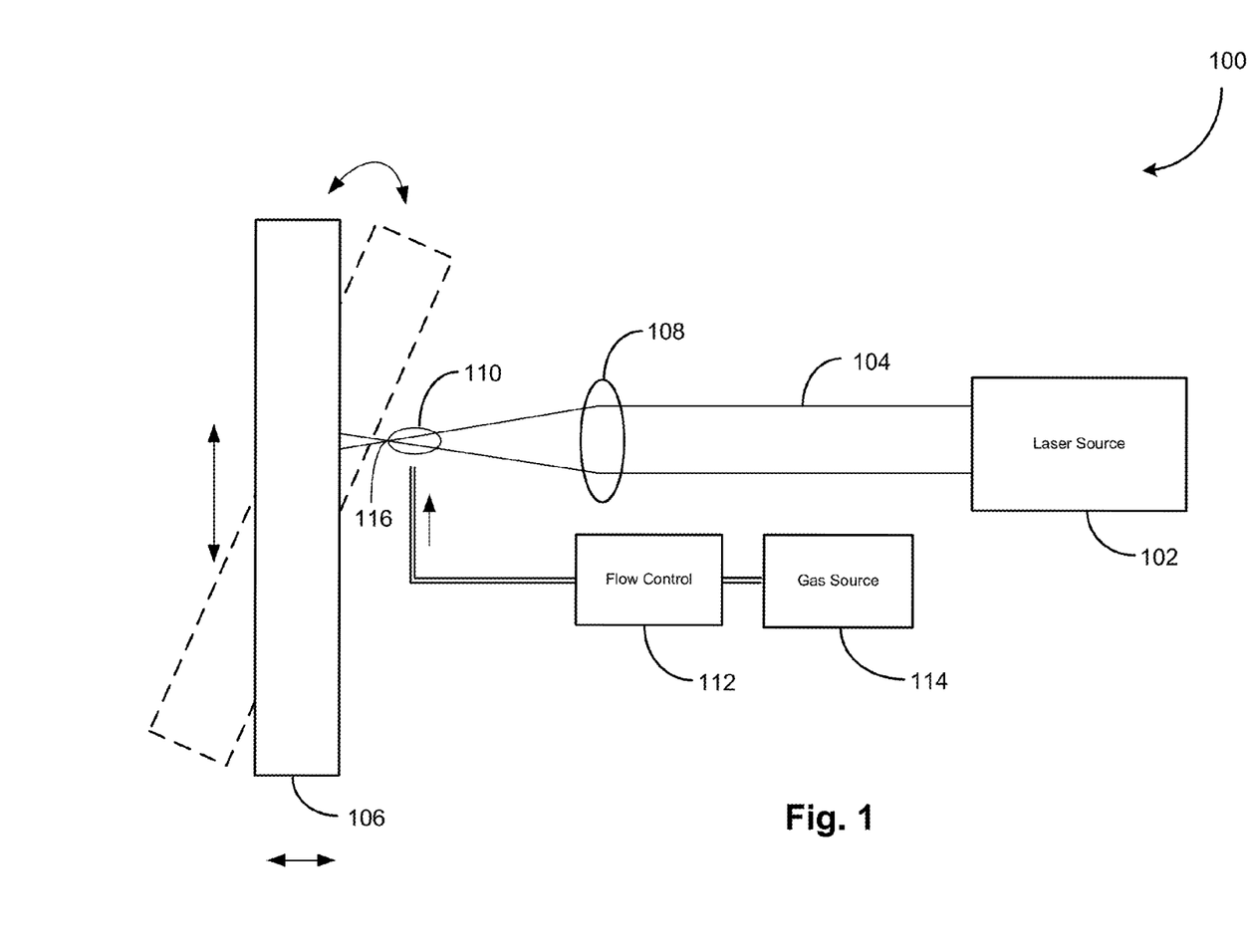
FIG. 1 is high-level block diagram of a system for removing material from a substrate according to an embodiment of the present invention.

FIG. 1 is a high-level block diagram of a system 100 for performing the laser induced gas-plasma machining process according to an embodiment of the present invention. System 100 includes a laser source 102 that can output a laser beam 104. Laser source can include any conventional laser source. In a particular embodiment, a YAG laser operating at 3 watts and having a wavelength of about 355 nanometers can be used. Laser beam 104 can pass through a focusing lens 108 to focus at point 116. In some embodiments, the beam diameter is about 10 micrometers and the focal length of lens 108 is about 50 millimeter. A gas, e.g., air or Nitrogen, can be provided at or near focus point 116. As illustrated in FIG. 1, a gas source 114 can provide the desired gas via flow control mechanism 112. In the vicinity of focus point 116, laser beam 104 can break down the gas to form gas-plasma 110. Gas plasma 110 is formed such that a majority of the gas-plasma is directed away from the focus point towards lens 108. The laser energy needed to generate the gas plasma depends on several factors including primarily on the type of gas. In one embodiment, the laser energy may be between 20 and 50 mJ. Laser source 102 can be operated to provide a series of short duration laser pulses with a repetition frequency of between 10 Hz and 100 Hz and having a pulse duration of about 7-10 nanoseconds.

Substrate 106 that is to be machined can be brought in contact with gas-plasma 110 by translating substrate 106 in a horizontal, a vertical, and/or a radial direction as needed. As the surface of substrate 106 is brought in contact with gas-plasma 110, the ionized species in the gas-plasma react with the surface material resulting in removal of surface material. Since laser beam 104 is not focused at the surface of substrate 106, the temperature at the surface of the substrate can be kept at a lower level to avoid the problems described above. In a particular embodiment, the resulting gas-plasma has a life of less than 1 minute thus further limiting the exposure time of substrate 106 and reducing the damage that may be caused by the laser. In some embodiments, the half-life of the gas-plasma is in the microsecond range.

Further, while system 100 is described herein with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Embodiments of the present invention can be realized in a variety of devices including electronic devices implemented using any combination of circuitry and software.

Figure 2:
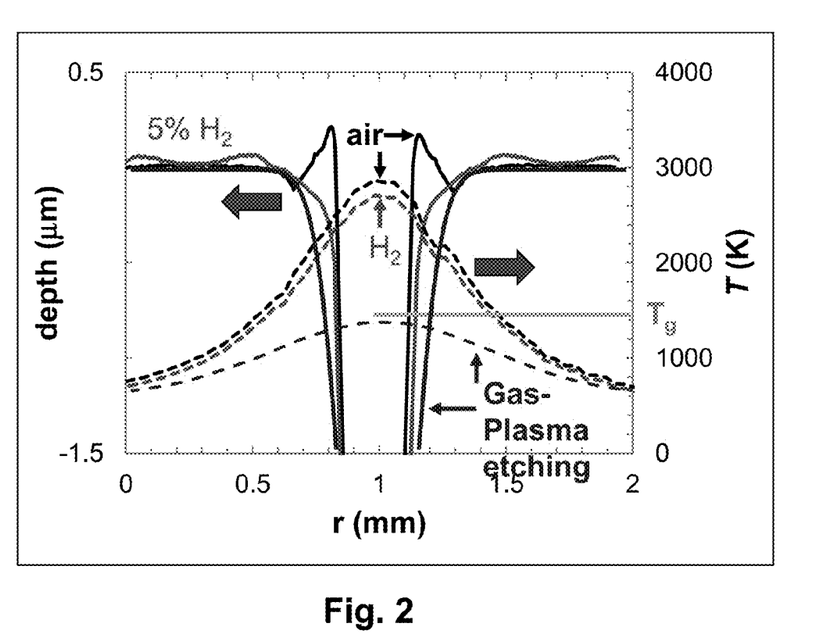
FIG. 2 illustrates the beneficial effects of using embodiments of the present invention.
Figure 3:
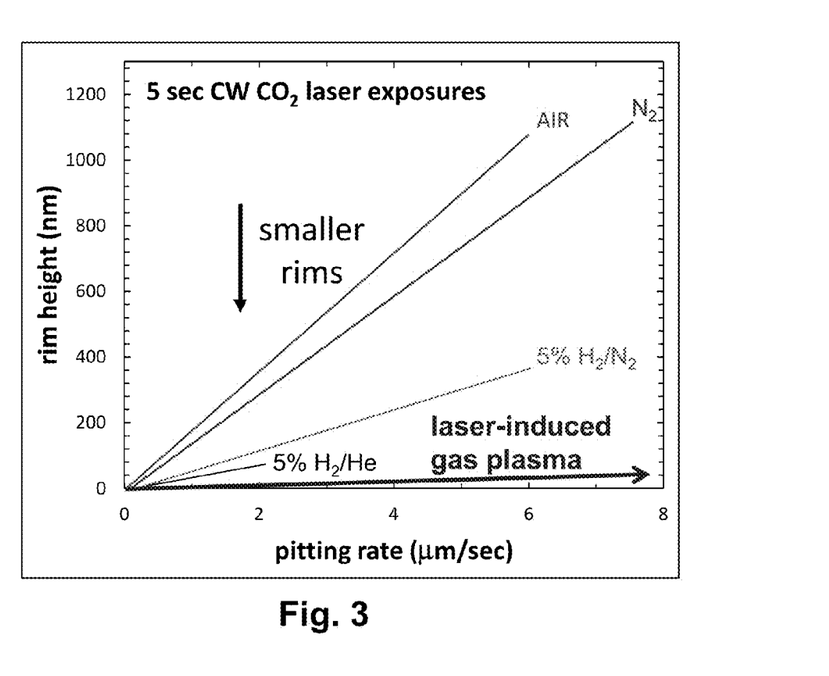
FIG. 3 illustrates the effect of techniques disclosed herein on rim height and pitting rate.

FIG. 2 is a graph showing the relationship between the temperature and surface profiles using various laser-based etching techniques. As can be seen from FIG. 2, the gas-plasma etching as disclosed herein provides the most uniform surface profile over a surface of a substrate. Also, as is evident from FIG. 2, gas-plasma etching reduces the amount of rim that may be formed when the etching is performed. FIG. 3 illustrates the relationship between the rim height and pitting rate using conventional method and the gas-plasma etching described herein. As can be seen from FIG. 2, as the pitting rate increases so does the rim height for the conventional processes. However using the gas-plasma etching technique disclosed herein, it can be seen that even with an increase in pitting rate (or etch rate), the rim height barely increases. Thus, using embodiments disclosed herein it is possible to increase the etch rate while at the same time minimizing the rim height to get a more uniform etch profile.

Figure 4:
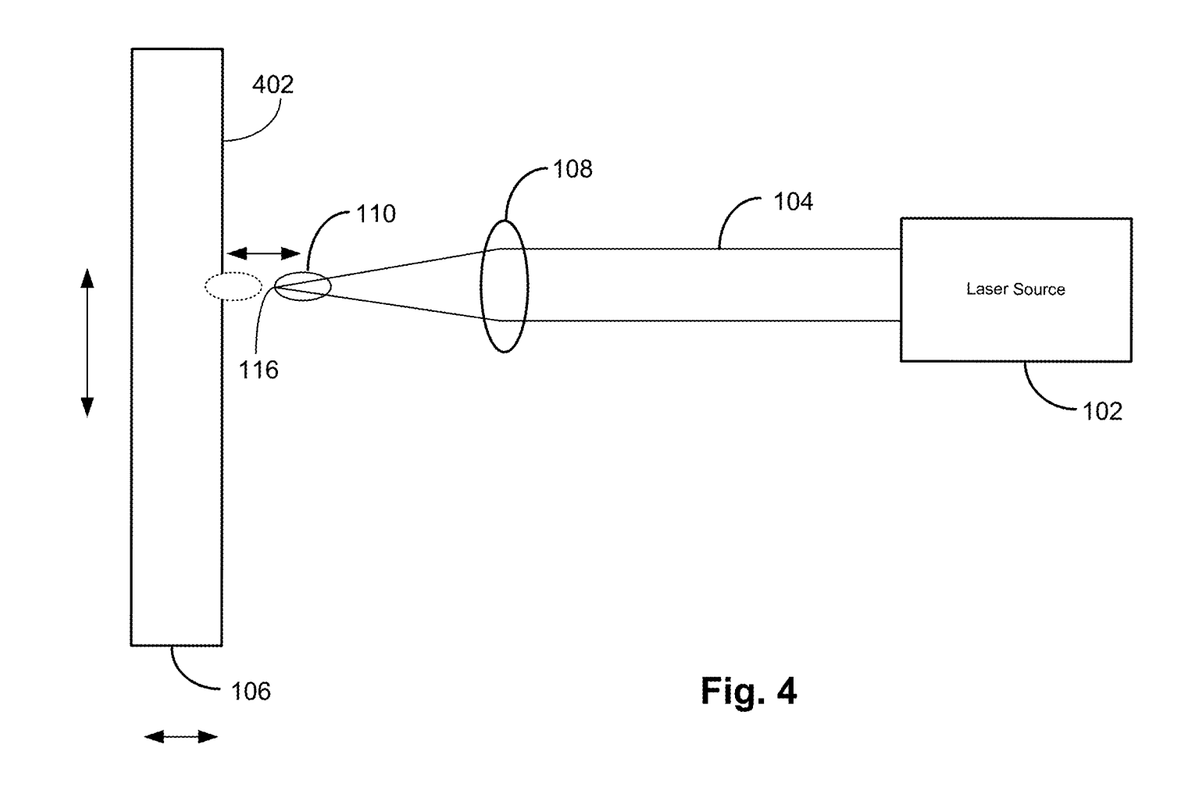
FIG. 4 is a functional block diagram of a first embodiment of the present invention.

FIG. 4 is a schematic representation of a first embodiment of the present invention. In this embodiment, laser beam 104 is focused at a point 116 in front of surface 402 of substrate 106 to be machined. In a particular embodiment, focus point 116 is located at distance of between 3 mm and 5 mm from the surface of the substrate. A gas is introduced in the vicinity of focus point 116. The energy from laser beam 104 breaks down the gas to form gas-plasma 110. Gas plasma 110 includes ionized species and free radicals generated by the gas breakdown. These ionized species and free radicals are highly reactive. Gas-plasma 110 propagates backward from focus point 116 in the direction towards laser source 102. Substrate 106 can be moved laterally to bring a portion of surface 402 in contact with gas plasma 110. The ionized species and free radicals in the gas plasma react with the material on surface 402 to remove a portion of the material. The exposure time and location of the substrate can be controlled by movement of substrate 106 and/or operation of laser source 102 to get the desired results. The mechanism of breaking down a gas using a laser to generate plasma is well-known in the art and the description of that is not provided herein. In some embodiments, substrate 106 can be mounted on a stage. The movement of the stage in various axes can be accomplished using any of the known conventional means of motion control. The details of the motion control mechanism are not provided herein since they are known in the art. In this embodiment, even though the laser beam is focused at a distance from the surface of the substrate, as the substrate is moved closer to the gas-plasma, the gas-plasma may cause damage to the surface due to plasma scalding. In addition, as the substrate moves closer to the focus point 116, the laser beam itself may cause some surface damage. Depending on the material being machined such damage may or may not be acceptable. However, it is to be noted that this embodiment is suitable for materials that can resist plasma-scalding. In some embodiments, instead of moving the substrate, focus point 116 can be moved in order to move the gas-plasma closer or farther from the substrate.

Figure 5:
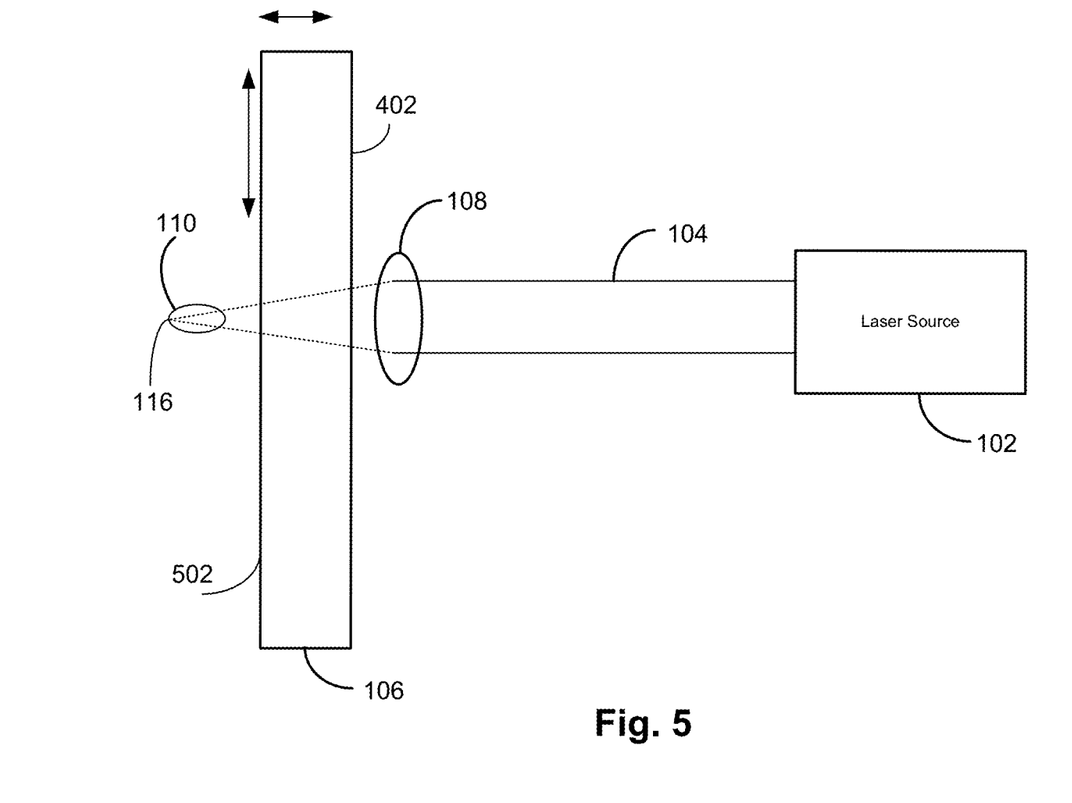
FIG. 5 is a functional block diagram of a second embodiment of the present invention.

FIG. 5 illustrates a second embodiment of the present invention. In this embodiment, laser beam 104 passes through substrate 106 and converges at a focus point 116 on the other side of substrate 106. Gas is provided at or near focus point 116 and gas-plasma 110 is generated, as described above. As can be seen, gas-plasma 110 projects backward from focus point 116 towards surface 502 of substrate 106. Substrate 106 can then be moved horizontally and/or vertically in order to expose a portion of surface 502 to gas-plasma 110. In a particular embodiment, gas-plasma 110 may be generated at a distance of between 10 and 15 mm from surface 502. Since the gas-plasma propagates backwards from the focus point, having the focus point on the other side of substrate 106, helps with ability to expose the surface 502 to more of the gas-plasma without having to worry about the substrate coming in contact with the laser beam itself. FIG. 5 shows this clearly where gas-plasma 110 propagates away from the focus point and towards the surface of the substrate. In contrast, as illustrate in FIG. 4 above, the gas plasma propagates away from the focus point and away from the surface 402 of the substrate. This prevents the laser beam from etching the surface and helps to use more of the gas plasma to perform the etching. This particular set-up may also suffer from the same issues as described above in reference to FIG. 4, but may be suitable in cases where material damage due to the laser is not an issue or in cases the material is such that the laser cannot damage the material at all.

Figure 6:
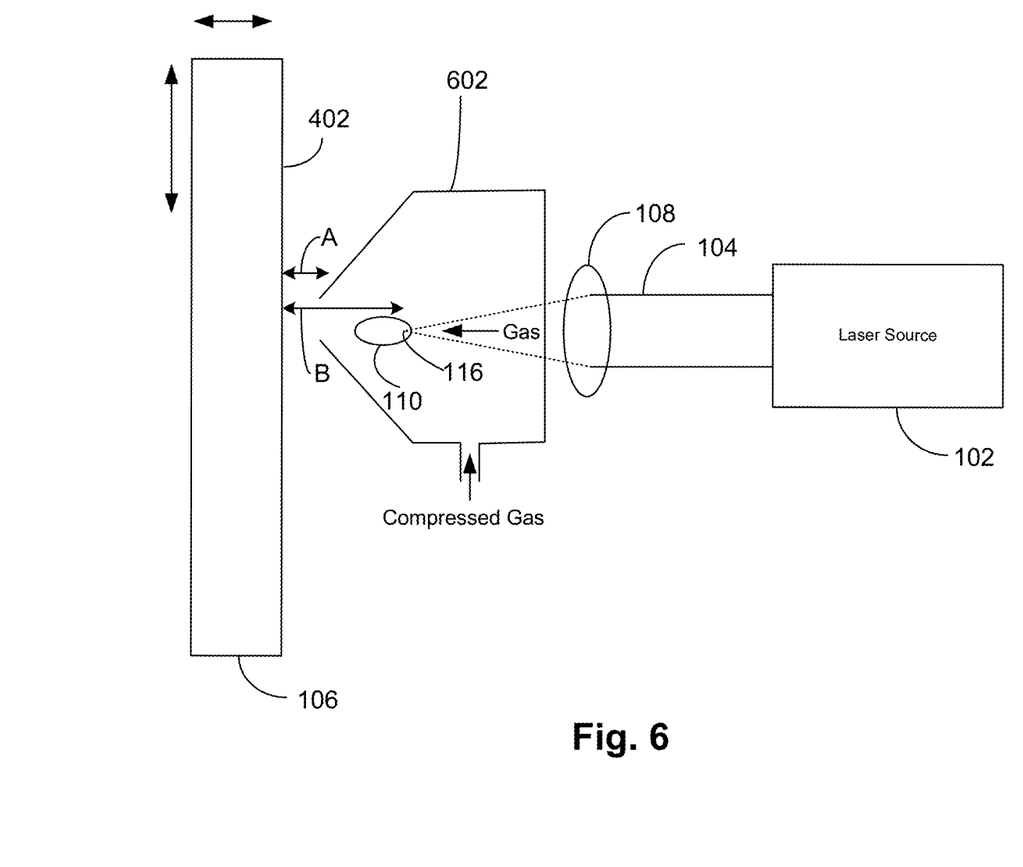
FIG. 6 is a functional block diagram of a third embodiment of the present invention.

FIG. 6 illustrates a third embodiment of the present invention. In this embodiment, laser beam 104 converges inside a nozzle 602. A compressed gas is provided at or near focus point 116 inside the nozzle to generate the gas plasma. Once generated, gas-plasma 110 is pushed towards surface 402 of substrate 106 by the excess gas left over after generation of the gas-plasma. In this configuration, it is possible to keep the focus point 116 away from the surface of the substrate. In a particular embodiment, distance B is between 3 and 6 mm. Since the excess gas is being used to "push" gas plasma 110 towards surface 402 of substrate 106, there is minimal to no interaction between the laser beam and the substrate, thus significantly reducing the amount of damage that may be caused by the laser beam itself. The tip of nozzle 602 can be placed at a distance A of about 1 mm from surface 602. In an embodiment, flow rate of the compressed gas can be between 5 L/min to about 20 L/min. The compressed gas that may be used can include air, Nitrogen, Argon, Hydrogen, or any other suitable reactive gas. By modulating the beam energy spatial distribution, the same energy of the laser beam can be used to generate the plasma at focus, yet most of the high intensity beam portion can be obstructed/clipped by the nozzle walls when the beam diverges and propagates forward. In this embodiment, only the portion near the axis of the beam passes through the nozzle opening reducing the surface exposure to the laser beam and the risk for surface damage.

Figure 6A:
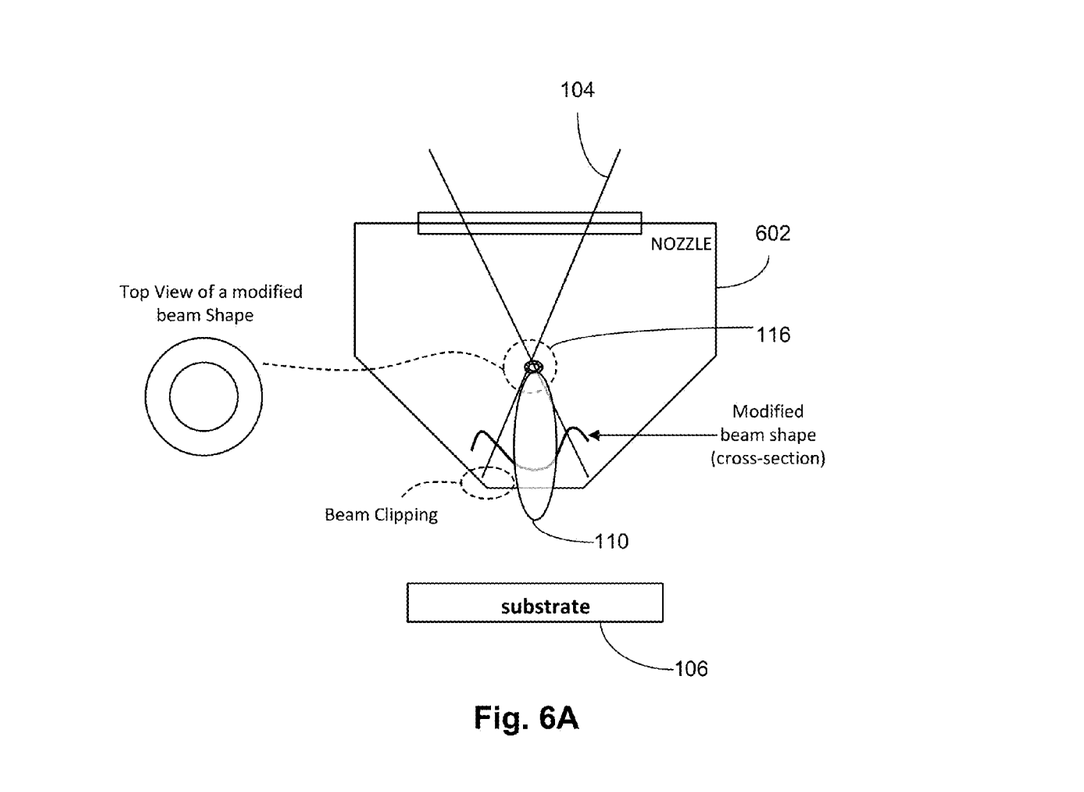
FIG. 6A is a schematic illustrating the beam shaping according to an embodiment of the present invention.
Figure 6B:
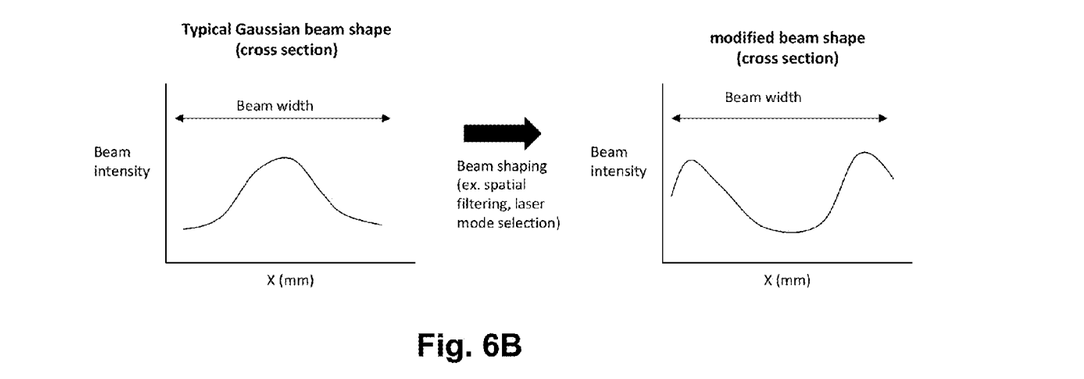
FIG. 6B illustrates cross-sections of a conventional laser beam and a laser beam modified according to an embodiment of the present invention.

As can be seen from FIG. 6, the line of sight of the laser beam is slightly off-center in order to avoid the laser beam from causing any damage to the substrate itself. In some embodiments, beam shaping can further improve on that beam screening by, for ex., having the beam energy concentrated in a donut shape, such that at the surface you get less exposure, but the sides of the beams are clipped, or is obstructed by the opening of the nozzle where the gas exits. FIG. 6A illustrates this aspect. As illustrated in FIG. 6A, the divergent light from laser beam 104 is blocked by the walls of nozzle 602 preventing the light from reaching substrate 106 thus reducing the exposure of substrate 602 to laser beam 104. Beam shaping can further improve on that beam screening by, e.g., having the beam energy concentrated in a donut shape, such that at the surface you get less exposure, but the sides of the beams are clipped, or is obstructed by the opening of the nozzle where the gas exits. As illustrated in FIG. 6B, by modulating the beam energy spatial distribution, the same energy can be used to generate the plasma at focus, yet most of the high intensity beam portion can be obstructed/clipped by the nozzle walls when the beam diverges and propagates forward. In this embodiment, only the portion near the axis of the beam passes through the nozzle opening reducing the surface exposure to the laser beam and the risk for surface damage.

Figure 7:
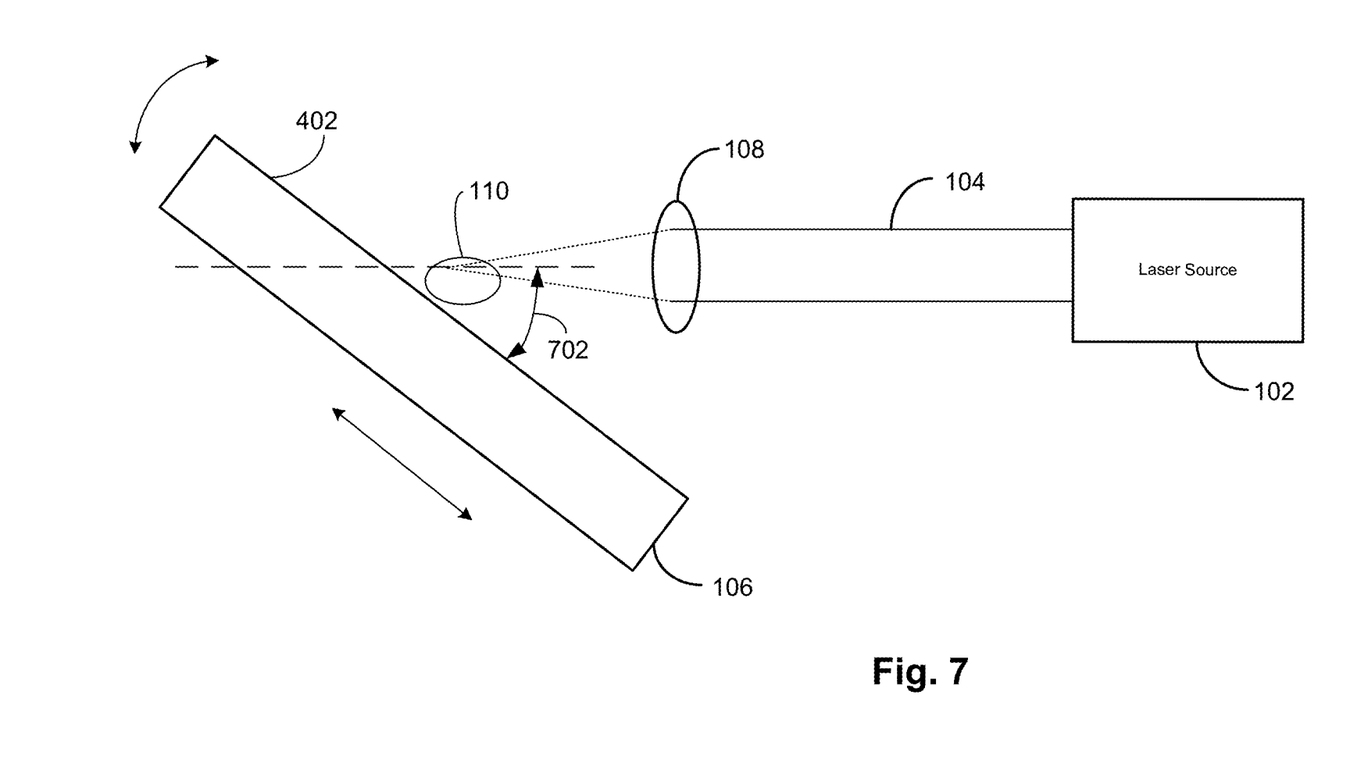
FIG. 7 is a functional block diagram of a fourth embodiment of the present invention.

FIG. 7 illustrates a fourth embodiment of the present invention. In this embodiment, instead of gas-plasma 110 being directly impinged on the substrate surface in a directional perpendicular to the substrate surface 402 (as in the embodiments of FIGS. 4, 5, and 6), substrate 106 is held at an angle 702 compared to the gas plasma. The gas-plasma is generated similar to all the previous embodiments described above. However, since the substrate is held at an angle to the gas-plasma there is no interaction between the laser beam itself and the surface of the substrate. In a particular embodiment, angle 702 between surface 402 of the substrate and the axis of the laser beam is less than 20 degrees. Since the gas-plasma in this embodiment glances or grazes the surface of the substrate, a uniform and more precise etching of the substrate surface and can be achieved by moving substrate 106 as needed. In addition, since the laser beam is focused away from the surface of the substrate, the potential damage caused by the laser beam can be minimized or eliminated.

Figure 8:
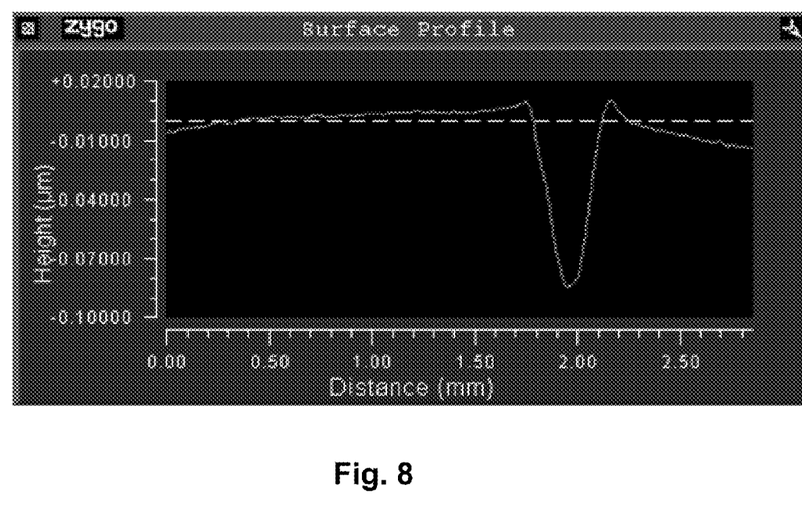
FIG. 8 illustrates results of etching a substrate using an embodiment of the present invention.

In one embodiment, the surface temperature of the substrate can reach between 2000 and 2500 Kelvin. This helps with reduced redeposit of material even if there is some melting of material on the surface of the substrate. FIG. 8 illustrates result of etching of substrate using embodiments of the present invention.

Figure 9:
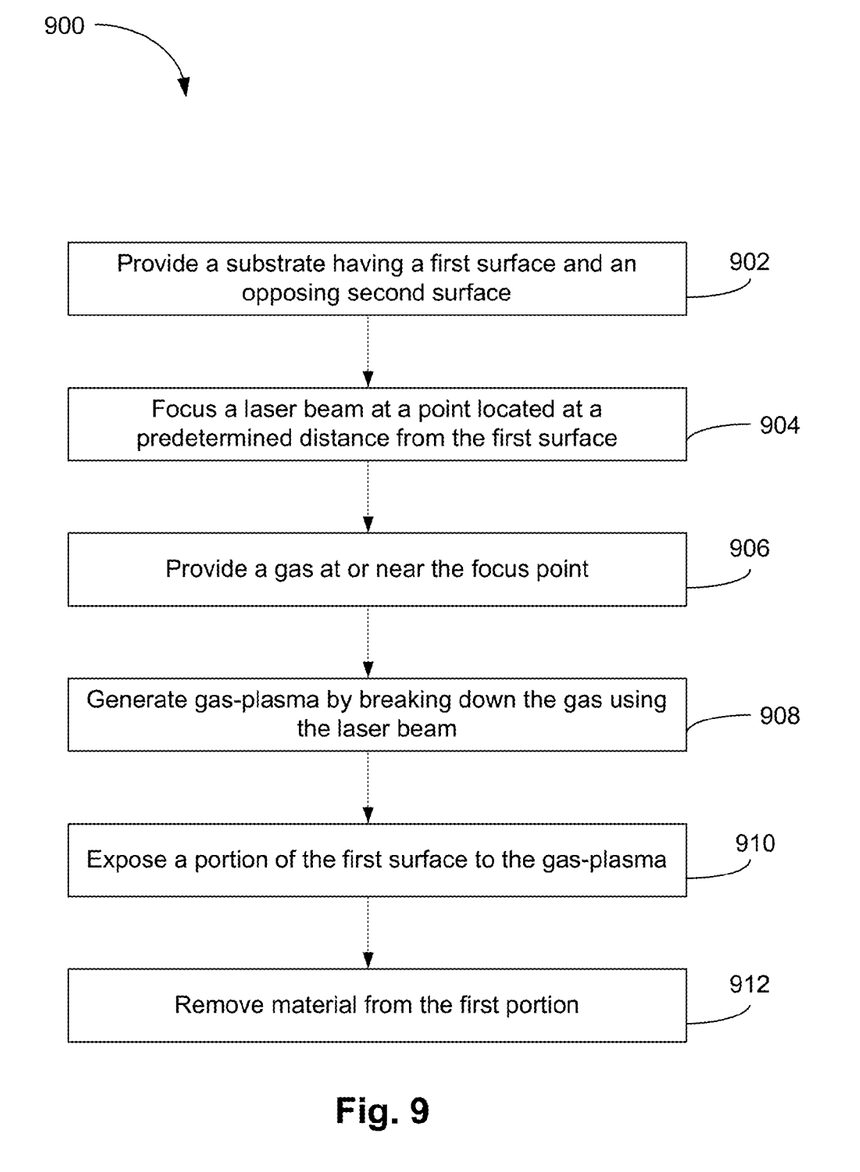
FIG. 9 is a flow diagram of a process for removing material from a substrate according to an embodiment of the present invention.

FIG. 9 is a flow diagram of a process 900 for removing material from the surface of a substrate according to an embodiment of the present invention. Process 900 may be performed, e.g., by system 100 of FIG. 1. Process 900 begins at step 902 where a substrate to be etched is provided. As described above, the substrate can include a fused-silica based component, a metal, a ceramic, or any other material. At step 904, a laser beam is focused at a predetermined distance from the surface of the substrate. The laser beam is focuses such that the laser beam does not reach the surface of the substrate but rather terminates at the focus point. In some embodiments, the predetermined distance is between 3 and 10 mm from the surface of the substrate. At step 906, a gas is provided at or near the focus point of the laser. In some embodiments, the gas may be chosen from a group consisting of air, Nitrogen, Hydrogen, HF, CF4, etc. At step 908, the laser energy breaks down the gas at the focus point and generates a gas-plasma. The generated gas-plasma propagates in a directed away from the focus point and towards the source of the laser beam. At step 910, the surface of the substrate is brought in contact with the gas-plasma either by moving the substrate or moving the gas-plasma. Once a portion of the surface of the substrate is exposed to the gas-plasma, the gas-plasma can etch and remove the material at that portion, at step 912. As described above, the substrate can be oriented in an number ways compared to the gas-plasma.

It should be appreciated that the specific steps illustrated in FIG. 9 provide a particular method of etching a surface according to an embodiment of the present invention. Other sequences of steps may also be performed according to alternative embodiments. For example, alternative embodiments of the present invention may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 10:
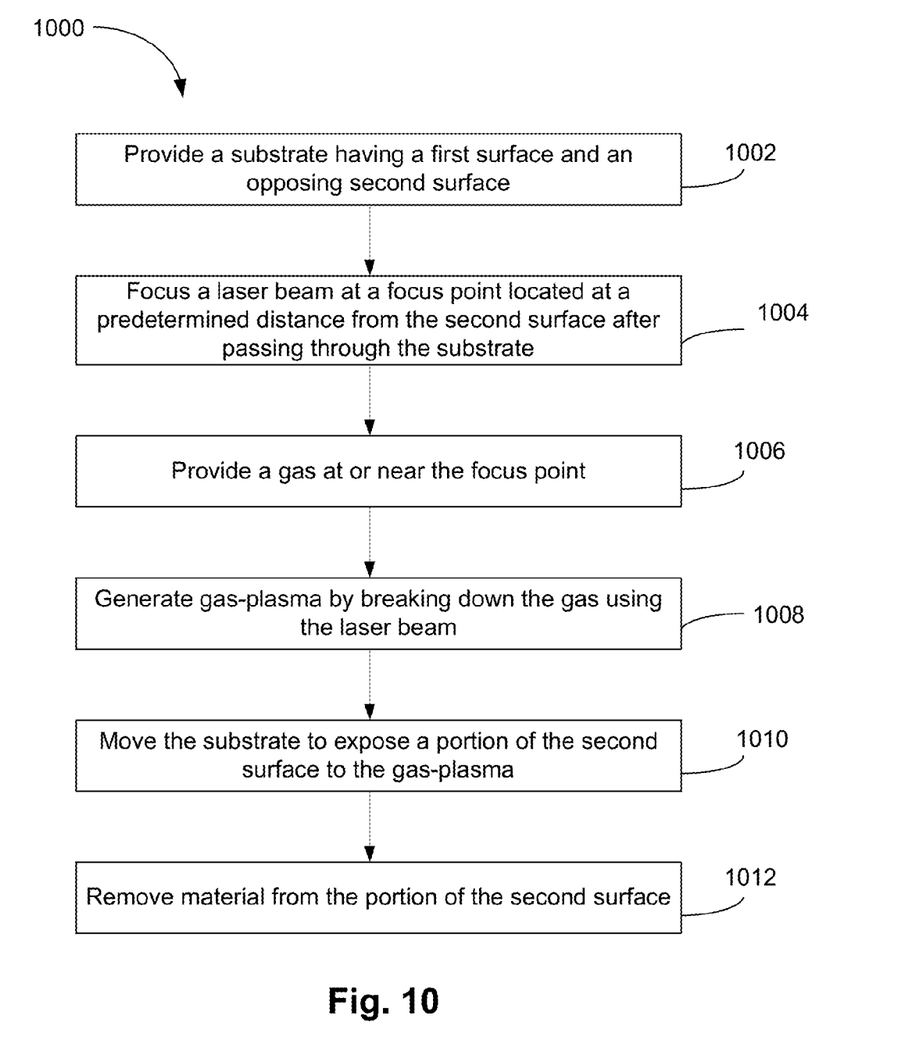
FIG. 10 is a flow diagram of a process for removing material from a substrate according to another embodiment of the present invention.

FIG. 10 is a flow diagram of a process 1000 for removing material from the surface of a substrate according to another embodiment of the present invention. Process 1000 begins at step 1002 where a substrate is provided. The substrate has a first surface and an opposing second surface. At step 1004, a laser beam is impinged on the first substrate. The laser beam passes through the substrate and is focused at a point located at a first distance from the second surface. At step 1006, a gas is provided at the focus point. At step 1008, gas plasma is generated by using the laser energy to breakdown the gas. The gas plasma includes free radicals that can react with the substrate material. At step 1010, the substrate is moved so as to enable contact between the gas plasma and a portion of the second surface. Thereafter at step 1012, material is removed from the portion of the second surface.

It should be appreciated that the specific steps illustrated in FIG. 10 provide a particular method of etching a surface according to an embodiment of the present invention. Other sequences of steps may also be performed according to alternative embodiments. For example, alternative embodiments of the present invention may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. One of ordinary skill in the art would recognize many variations, modifications, and alternatives.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method for removing material using plasma machining, the method comprising:
   providing a substrate having a first surface and an opposing second surface;
   passing a converging laser beam through the first surface, the substrate, and the opposing second surface to a location outside the substrate;
   focusing the laser beam, after the laser beam has passed through the opposing second surface, at a focus point located outside the substrate and at a first distance beyond the opposing second surface of the substrate;
   providing a gas at or near the focus point;
   generating gas plasma by breaking down the gas using energy from the laser beam, the gas plasma being oriented away from the focus point and towards the opposing second surface of the substrate;
   exposing a portion of the opposing second surface outside the substrate to the gas plasma; and
   removing material from the portion of the opposing second surface using plasma machining.

2. The method of claim 1 wherein the energy generated by the laser beam is between 25 mJ and 50 mJ.

3. The method of claim 1 further comprising moving the substrate prior to exposing the portion of the opposing second surface to the gas plasma.

4. The method of claim 1 wherein the laser beam is generated using a YAG laser.

5. The method of claim 1 wherein the gas includes one at least of air, Nitrogen, Argon, or Hydrogen.

6. The method of claim 1 wherein the gas includes at least one of Hydrogen Fluoride (HF) or Carbon Tetraflouride ($CF_4$).

7. The method of claim 1 wherein the substrate includes at least one of fused-silica, metal, or ceramic.

8. The method of claim 1 wherein the first distance is between 3 mm and 10 mm.

9. The method of claim 1 wherein the substrate is disposed at an angle with respect to a path of the laser beam.

10. The method of claim 9 wherein the angle is less than 20 degrees.

* * * * *